United States Patent [19]
Frank et al.

[11] Patent Number: 5,608,254
[45] Date of Patent: Mar. 4, 1997

[54] METHOD FOR FORMING ELECTRICAL CONTACT TO THE OPTICAL COATING OF AN INFRARED DETECTOR USING CONDUCTIVE EPOXY

[75] Inventors: Steven N. Frank, McKinney; James F. Belcher; Charles E. Stanford, both of Plano; Robert A. Owen; Robert J. S. Kyle, both of Rowlett, all of Tex.

[73] Assignee: Texas Instruments Incorporated, Dallas, Tex.

[21] Appl. No.: 473,838

[22] Filed: Jun. 7, 1995

Related U.S. Application Data

[62] Division of Ser. No. 397,706, Mar. 1, 1995, Pat. No. 5,552,326.

[51] Int. Cl.⁶ .................................................. H01L 31/0232
[52] U.S. Cl. .................... 257/432; 257/437; 257/444; 257/448; 257/459; 250/332; 250/338.4
[58] Field of Search ................... 257/448, 443, 257/459, 432, 444, 437; 250/332, 338.4

[56] References Cited

U.S. PATENT DOCUMENTS

| | | |
|---|---|---|
| 4,740,700 | 4/1988 | Shaham et al. ................. 250/332 |
| 5,047,644 | 9/1991 | Meissner et al. ................ 250/332 |
| 5,426,304 | 6/1995 | Belcher et al. .................. 250/332 |
| 5,485,010 | 1/1996 | Owen et al. ..................... 250/332 |

*Primary Examiner*—William Mintel
*Attorney, Agent, or Firm*—Kay Houston; James C. Kesterson; Richard L. Donaldson

[57] ABSTRACT

This is a system and method of forming an electrical contact to the optical coating of an infrared detector using conductive epoxy. The method may comprise: forming thermal isolation trenches 22 and bias contact vias 23 in a substrate 20; depositing a trench filler 24 in the thermal isolation trenches 22; depositing conductive epoxy 50 into the bias contact vias 23; replanarizing; depositing a common electrode layer 31 over the thermal isolation trenches 22 and vias 23; depositing an optical coating 26 above the common electrode layer 31; mechanically polishing a backside of the substrate 20 to expose the trench filler 24 and conductive epoxy 50; depositing a contact metal 34 on the backside of the substrate 20; etching the contact metal 34 and the trench filler 24 to form pixel mesas of the contact metal 34 and the substrate 20.

18 Claims, 2 Drawing Sheets

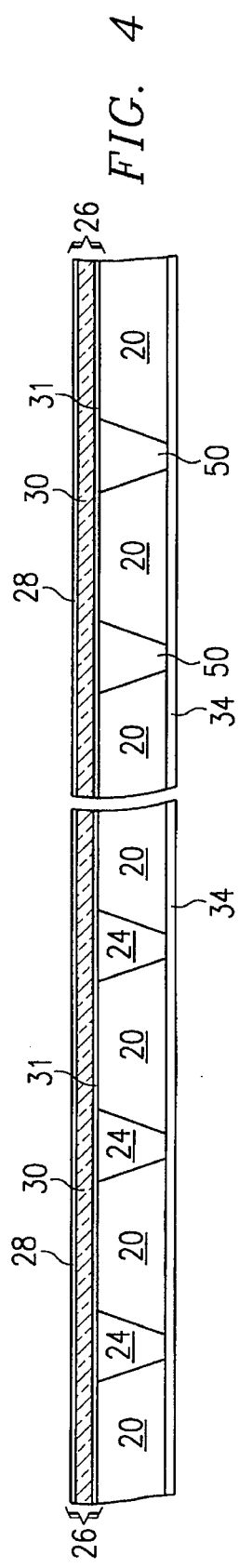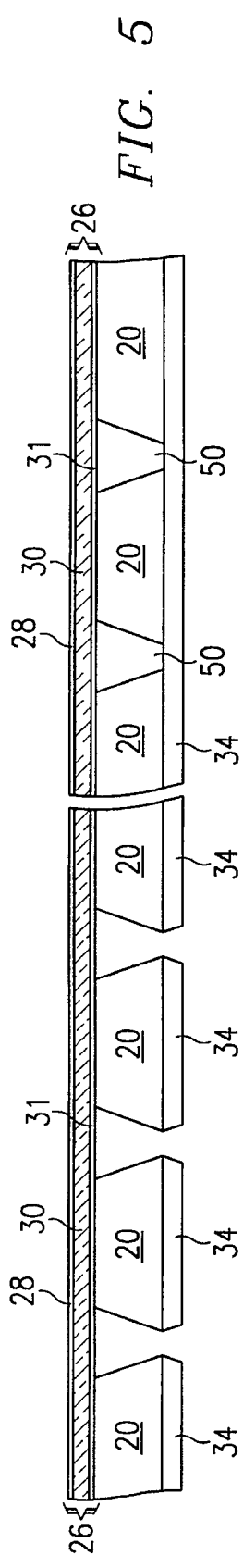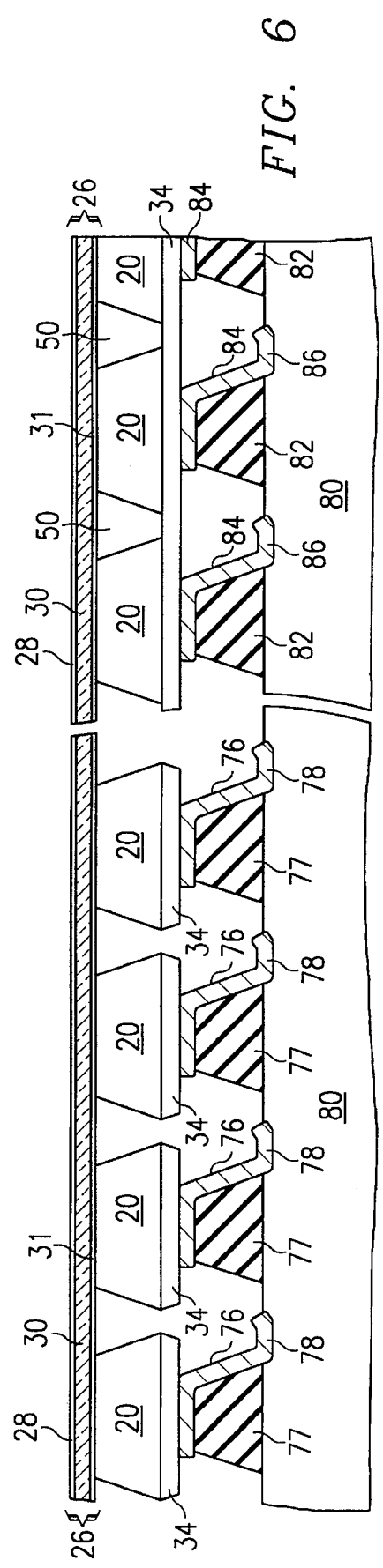

METHOD FOR FORMING ELECTRICAL CONTACT TO THE OPTICAL COATING OF AN INFRARED DETECTOR USING CONDUCTIVE EPOXY

This is a divisional of application Ser. No. 08/397,706, filed Mar. 1, 1995, now U.S. Pat. No. 5,552,326.

CROSS-REFERENCE TO RELATED APPLICATION

The following coassigned patent applications and issued patent are hereby incorporated herein by reference:

| Serial No. | Filing Date | TI Case No. |
|---|---|---|
| 08/223,073 | 04/04/94 | TI-18726 |
| 08/223,088 | 04/04/94 | TI-18727 |

| Patent No. | Filing Date | Inventor |
|---|---|---|
| 5,466,332 | 04/04/94 | Owen et al. |

FIELD OF THE INVENTION

This invention generally relates to infrared (IR) detector arrays and means of fabrication.

BACKGROUND OF INVENTION

The novel IR devices and fabrication processes to be described are related to the types of IR detector arrays recorded in (1) U.S. Pat. No. 4,080,532, Hopper, Mar. 1978; (2) U.S. Pat. No. 4,745,278, Hanson, May 1988; (3) U.S. Pat. No. 4,792,681, Hanson, Dec. 1988; (4) "LOW-COST UNCOOLED FOCAL PLANE ARRAY TECHNOLOGY", by Hanson, Beratan, Owen and Sweetser; presented Aug. 17, 1993 at the IRIS Detector Specialty Review; (5) cross-referenced patent application Ser. No. 08/223,087, filed Apr. 04, 1994, (6) cross-referenced patent application Ser. No. 08/223,088, filed Apr. 04, 1994, and (7) cross-referenced patent application Ser. No. 08/223,073, filed Apr. 04, 1994.

The physical requirements of uncooled arrays and a description of fabrication processes are covered in some detail in the above references. A line scanner may contain from several hundred to a few thousand and an area imager several thousand to tens of thousand individual picture elements (pixels.) Each of these pixels consists of a capacitor that has a heat (IR intensity) sensitive dielectric such as barium strontium titanate (BST.) The electronic connections to these capacitors are greatly simplified if one of the capacitor terminals is made common to all. Previously described in the references are methods to attach hundreds to tens of thousands of electrical connections between the other isolated terminals of the pixel capacitors and the electronic sensing circuitry housed on an external integrated circuit (IC.) In addition, the pixel capacitors must be thermally isolated from each other while having one terminal connected to all the other common terminals.

The common connection to one side of the pixel capacitors consists of a front side thin film referred to as the optical coating. This may be a composite of a plurality of thin films having the desired physical properties, such as IR transparency, electrical conductivity, thermal conductivity, etc. The thicker heat sensitive dielectric substrate in this case can be barium-strontium-titanate (BST) which is a ceramic like material.

SUMMARY OF THE INVENTION

Most of the previous inventions are concerned with how to achieve thermally isolated pixels and attach them to a companion silicon integrated circuit without damage to the fragile IR sensing array circuitry. The IR sensing side of the array contains the previously mentioned optical coating. This typically consists of three or four layers. The outermost layer is a semitransparent thin metal film such as nichrome (NiCr). The underlying wavelength tuning layer has a thickness of an odd number of quarter wavelengths at the desired IR wavelength. This tuning layer is transparent to IR and may be parylene. The underlying metal completes the optical filter properties and may also be the sole electrical contact for a common electrical connection to all the pixels. Typically this layer is a thicker film of NiCr. An improved structure, such as described in the references, may have a more rugged fourth layer. Sometimes this fourth layer results in a structure referred to as an elevated optical coating.

Although much detail and many variants of the pixel isolation and connection processes are described in the references, not mentioned is the method whereby the common electrode of the optical layer is electrically connected to a voltage or current biasing supply. Heretofore this has been accomplished in a very primitive and unreliable manner by physically scraping away the top two coatings of the optical layer at the periphery of the IR sensing army and attaching a free wire with electrically conducting epoxy.

This invention describes novel means of effecting this common electrode biasing connection in a more production worthy and reliable manner. This is a system and method of forming an electrical contact to the optical coating of an infrared detector using conductive epoxy. The method may comprise: forming thermal isolation trenches in a substrate; depositing a trench filler in the thermal isolation trenches; depositing a conductive epoxy in vias at the periphery of the substrate; replanarizing; depositing a common electrode layer over the thermal isolation trenches; depositing an optical coating above the common electrode layer; mechanically polishing a backside of the substrate to expose the trench filler; depositing a contact metal on the backside of the substrate, wherein said contact metal forms a bias contact with said conductive epoxy and said common electrode; and etching the contact metal and the trench filler to form pixel mesas of the contact metal and the substrate. This system and method may be applied to uncooled as well as cooled infrared detectors.

DESCRIPTION OF THE DRAWINGS

This invention can be best understood by reference to the following drawing(s), in which:

FIG. 4 depicts the mechanically thinned composite array with biasing contact area and a layer of contact metal on the backside of the array;

FIG. 5 shows a cross sectional sketch of the sensing array after the trench filler has been removed;

FIG. 6 show the final array structure after bonding to the companion IC.

Corresponding numerals and symbols in different figures refer to corresponding parts unless otherwise indicated.

DETAILED DESCRIPTION OF PREFERRED EMBODIMENTS

Figure 1:
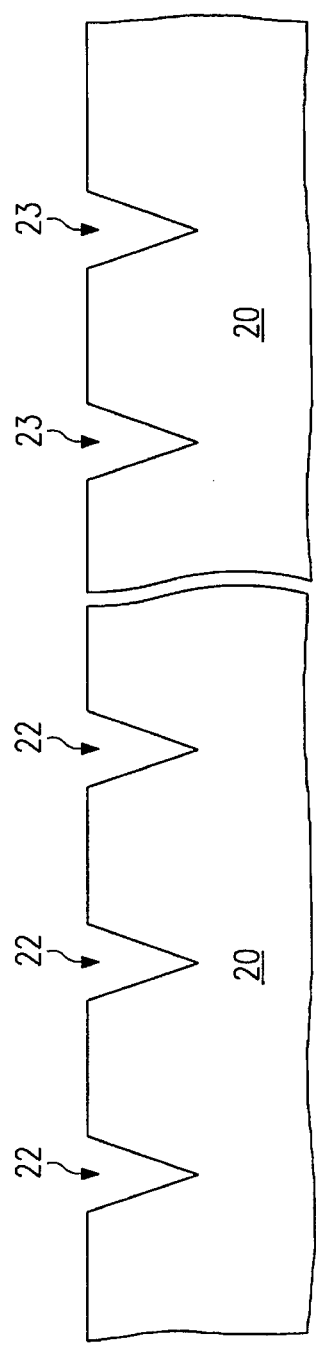
FIG. 1 shows a cross sectional sketch of an array after bias contact vias and thermal isolation trenches have been patterned and etched.

One preferred embodiment will be described with the aid of FIGS. 1–6 and TABLE 1. The figures have exaggerated layer thicknesses for descriptive purpose and are not to actual or relative scale to each other. In this embodiment, the BST substrate 20 is patterned from the front or optically sensitive side of the sensing array by the use of a laser to vaporize the substrate thereby forming thermal isolation trenches 22 between the thermally sensitive picture elements (pixels). As shown in FIG. 1, the vias 23 for the biasing contacts are formed in the same manner. These vias 23 are removed from the IR sensing area and have multiple locations around the border of the array. Although shown in these figures to be the same size as the thermal isolation trenches 22, these vias 23 may be larger if desired.

Figure 2:
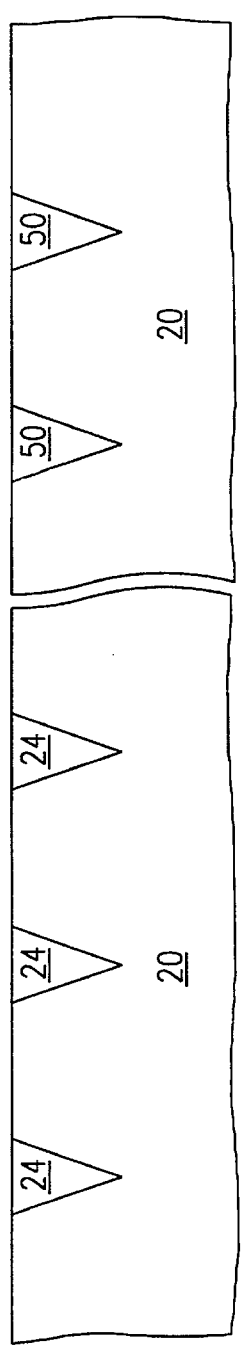
FIG. 2 shows a cross sectional sketch of an array after the bias contact vias have been filled with a conductive epoxy and the thermal isolation trenches have been filled with a trench filler and replanarized.

FIG. 2 exhibits the structure after several processing steps have been completed from FIG. 1. Trenches 22 have been filled with parylene 24 and the surface has been mechanically polished to planarize the front side of the IR detector. In addition, the bias contact vias have been filled with a conductive epoxy 50. The conductive epoxy may then be planarized. Of course, the order of deposition of the trench filler and conductive epoxy may be switched. Additionally, both materials may be planarized at one time after deposition.

Figure 3:
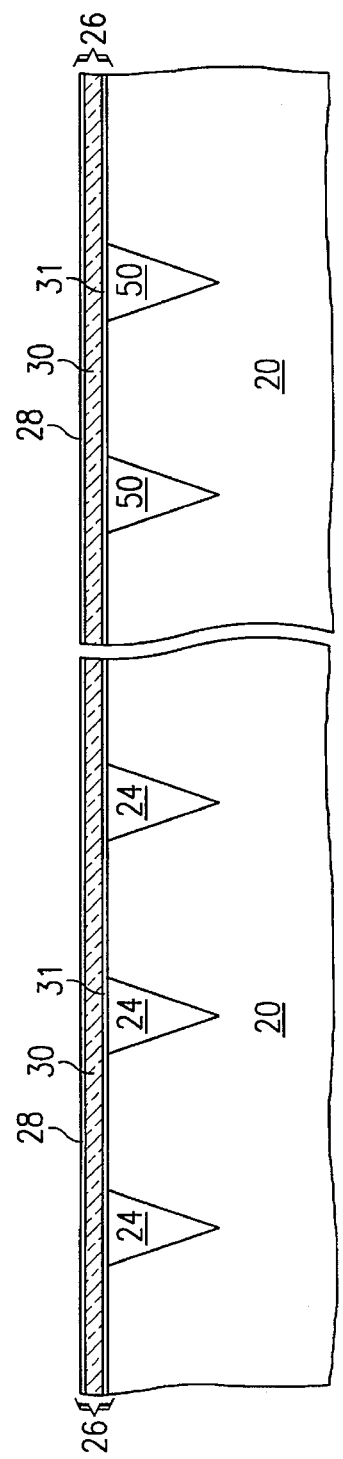
FIG. 3 shows the optical coating applied over the sensing and common biasing contact area.

After planarization, a three level optical coating 26 is deposited over all the pixels and bias contact vias 23 as shown in FIG. 3. The materials and thicknesses are shown in TABLE 1. The common electrode in this case is 31 and provides the functions of one side of the pixel capacitors and the electrical contact in the bias contact areas.

In FIG. 4, the substrate 20 has been thinned from the back side by mechanical polishing means to expose the parylene 24 and conductive epoxy 50.

FIG. 5 shows the array after removal of the parylene from the thermal isolation trenches. In addition, FIG. 5 shows the deposition of the back side contact metal 34 which typically consists of the alloys shown in TABLE 1. This metal 34 acts as a backside contact metal in the thermal sensing areas, as well as a bias contact metal in the bias contact areas.

After the use of standard photolithography, etching and cleaning techniques, and bumpbonding to the IC, the structure shown in FIG. 6 results. The capacitor pixel mesas 20 are defined by the optical coating 26, the thermally sensitive insulator 20 and the contact metal 34. IC bonding may now be performed to all the pixel mesas and the biasing pads. This establishes an electrical connection for the common pixel electrode bias voltage through 34 to 50 to 31. The IC elements are also described in TABLE 1.

TABLE 1

| ID# | Description | Material (dim) | Alternates |
|---|---|---|---|
| 20 | Thermally sensitive substrate | Barium strontium titanate | |
| 22 | Isolation trenches | Laser vaporized | Ion milled |
| 23 | Bias contact vias | Laser vaporized | Ion milled |
| 24 | Trench filler | Parylene | Photoresist, PMMA, epoxy |
| 26 | Optical coating | 3 layered | 1/4 IR wavelength |
| 28 | Transparent coat | NiCr 50 A | 25–100 A |
| 30 | 1/4 wavelength separator coat | Parylene 1.4 µm | 1/4 wavelength at desired IR |
| 31 | Electrical conducting coat | NiCr 1000 A | 500–2000 A |
| 34 | Backside electrical contact | Multiple alloys suitable for IC bonding. | 4-layer composite of 15–60 µm In 0.5–1.5 µm Au 0.5–1.5 µm NiCr 0.2–1.0 µm TiW |
| 50 | Bias contact material | Conductive Epoxy | |
| 76 | Ohmic connection for pixels | TiW | |
| 77 | IC contact mesa for sensing connection | Photosensitive polyimide, Dupont 2734 | PMMA |
| 78 | IC via for sensing circuit | | |
| 80 | IC processor | Si or GaAs | |
| 82 | IC contact mesa for bias connection | Photosensitive polyimide, Dupont 2734 | PMMA |
| 84 | IC Ohmic connection for bias connection | TiW | |
| 86 | IC via for bias circuit | | |
| 92 | IC bias contact pad | Conductive metal | |

Whether the isolation trenches are formed by laser vaporization, ion milling or other means, similar trenches may be patterned at the periphery of the array at the same time. All variants and combinations of these structures are considered within the scope of this invention.

While this invention has been described with reference to illustrative embodiments, this description is not intended to be construed in a limiting sense. It should be stressed again that the biasing vias shown in the illustrations were drawn for convenience and ease of description as if they were isolation trench type geometries. These vias are well removed from the sensing area and may be much larger or have many more to cover a more extensive area than shown in the figures. In some embodiments of these novel IR sensors, thermal isolation of the pixel capacitors is performed by partial etching from one side followed by etching to completion on the other side as has been described in the references. All of these methods can have the biasing vias patterned as a normal part of the process flow. In addition, this invention is not to be limited to uncooled infrared detectors. For example, this invention could be easily incorporated into the normal process flow for cooled infrared detectors as well.

Various modifications have already been described but other modifications and combinations of the illustrative embodiments, as well as other embodiments of the invention, will be apparent to persons skilled in the art upon reference to the description. It is therefore intended that the appended claims encompass any such modifications or embodiments.

We claim:

1. An infrared sensing device, said device comprising:
   an optical coating;
   a common electrode connected to said optical coating;
   thermal isolation mesas in a sensing area in said device and below said common electrode;
   bias contact areas around a periphery of said sensing area;
   a conductive epoxy connected to said common electrode.

2. The device of claim 1, wherein said conductive epoxy connects said device to a bias contact pad on an integrated circuit.

3. The device of claim 1, wherein said conductive epoxy connects said common electrode to an integrated circuit by a contact metal layer.

4. The device of claim 1, wherein said optical coating is a three layered optical coating.

5. The device of claim 4, wherein said three layer optical coating includes:
   an electrical conducting coating;
   a ¼ wavelength separator coating on top of said electrical conducting coating; and
   a transparent coat on top of said separator coating.

6. The device of claim 1, wherein said thermal isolation mesas is within a thermally sensitive substrate of barium strontium titanate.

7. The device of claim 1, wherein said common electrode is Au.

8. The device of claim 1, wherein said common electrode is NiCr.

9. The device of claim 1, wherein said common electrode is TiW.

10. An infrared detector connected to an integrated circuit (IC), said detector comprising:
    an optical coating;
    a common electrode connected to said optical coating;
    thermal isolation mesas in a sensing area in said detector and below said common electrode;
    bias contact areas around a periphery of said sensing area;
    a conductive epoxy connecting said common electrode to said IC; and
    a contact metal layer connecting said thermal isolation mesas to said IC.

11. The detector of claim 10, wherein said conductive epoxy connects said detector to a bias contact pad on said IC.

12. The detector of claim 10, wherein said conductive epoxy connects said common electrode to said IC by a contact metal layer.

13. The detector of claim 10, wherein said optical coating is a three layered optical coating.

14. The detector of claim 13, wherein said three layer optical coating includes:
    an electrical conducting coating;
    a ¼ wavelength separator coat on top of said electrical conducting coating; and
    a transparent coat on top of separator coating.

15. The detector of claim 10, wherein said thermal isolation mesas is within a thermally sensitive substrate of barium strontium titanate.

16. The detector of claim 10, wherein said common electrode is Au.

17. The detector of claim 10, wherein said common electrode is NiCr.

18. The detector of claim 10, wherein said common electrode is TiW.

* * * * *